United States Patent [19]
Kodama

[11] Patent Number: 5,366,915
[45] Date of Patent: Nov. 22, 1994

[54] PROCESS OF FABRICATING FLOATING GATE TYPE FIELD EFFECT TRANSISTOR HAVING DRAIN REGION GENTLY VARIED IN IMPURITY PROFILE

[75] Inventor: Noriaki Kodama, Tokyo, Japan

[73] Assignee: NEC Corporation, Japan

[21] Appl. No.: 107,921

[22] Filed: Aug. 16, 1993

[30] Foreign Application Priority Data

Aug. 28, 1992 [JP] Japan ............................ 4-230163

[51] Int. Cl.[5] .................................. H01L 21/266
[52] U.S. Cl. .................................. 437/43; 437/30; 437/35
[58] Field of Search ............ 437/29, 30, 35, 36, 437/43, 44, 149, 150, 153, 154, 157

[56] References Cited

U.S. PATENT DOCUMENTS

| | | | |
|---|---|---|---|
| 5,155,369 | 10/1992 | Current | 437/35 |
| 5,190,887 | 3/1993 | Tang et al. | 437/43 |
| 5,217,910 | 6/1993 | Shimizu et al. | 437/35 |

FOREIGN PATENT DOCUMENTS

| | | | |
|---|---|---|---|
| 2-292833 | 12/1990 | Japan | 437/35 |
| 4-000715 | 1/1992 | Japan | 437/35 |
| 4-127439 | 4/1992 | Japan | 437/35 |
| 4-171730 | 6/1992 | Japan | 437/35 |

OTHER PUBLICATIONS

Kodama et al., "A Symmetrical Side Wall (SSW)-DSA Cell for a 64Mbit Flash Memory" by IEDM, pp. 303-306, 1991.

*Primary Examiner*—Brian Hearn
*Assistant Examiner*—Chandra Chaudhari
*Attorney, Agent, or Firm*—Laff, Whitesel, Conte & Saret

[57] ABSTRACT

In a process of fabricating a floating gate type field effect transistor, an ion implantation for forming a drain region is repeated more than twice at different angles, and the drain region has an impurity profile gently changed by virtue of the ion implantation at the different angles so that a drain disturbe is effectively suppressed, thereby improving the stability of the data bit stored in the floating gate type field effect transistor.

13 Claims, 9 Drawing Sheets

PROCESS OF FABRICATING FLOATING GATE TYPE FIELD EFFECT TRANSISTOR HAVING DRAIN REGION GENTLY VARIED IN IMPURITY PROFILE

FIELD OF THE INVENTION

This invention relates to a floating gate type field effect transistor and, more particularly, to a process of fabricating a floating gate type field effect transistor having a drain region with a gentle impurity profile.

DESCRIPTION OF THE RELATED ART

The floating gate type memory cells accumulate electrons in the floating gate electrodes, and store data bits in the form of threshold level. The accumulated electrons are maintained in the floating gate electrodes without any electric power supply, and the floating gate type memory cells form essential parts of a non-volatile semiconductor memory device such as an electrically programmable read only memory device, an electrically erasable and programmable read only memory device or a flash-write electrically erasable and programmable read only memory device.

A typical example of a fabricating process for the floating gate type memory cell is illustrated in FIGS. 1A to 1D, and starts with preparation of a p-type semiconductor substrate 1. On the major surface of the p-type semiconductor substrate 1 are patterned a gate structure 2 which consists of a first gate oxide film 2a on a channel region 1a in the major surface, a floating gate electrode 2b on the first gate oxide film 2a, a second gate oxide film 2c on the floating gate electrode 2b and a control gate electrode 2d on the second gate oxide film 2c as shown in FIG. 1A.

A photoresist film covers the entire surface of the structure, and is patterned through a lithographic process so as to provide a mask 3 for an ion implantation. The mask 3 covers a part of the gate structure 2 and a predetermined area in the major surface assigned to a source region. However, the photoresist film 3 is removed from a remaining part of the gate structure 2 and another predetermined area assigned to a drain region. The p-type semiconductor substrate 1 is placed in an ion-implantation system, and boron B is ion-implanted into the major surface of the p-type semiconductor substrate 1 at dose of $3 \times 10^{13}$ cm$^{-2}$ under acceleration energy at 70 KeV. The Ion-implantation system is regulated in such a manner that the radiation of boron B declines at a predetermined angle A1 from a normal line 4 with respect to the major surface of the p-type semiconductor substrate 1, and the predetermined angle A1 is about 60 degrees. As a result, the boron reaches the channel region, and a p-type impurity region 1b extends over the predetermined area for the drain region as shown in FIG. 1B. The p-type impurity region 1b is higher in impurity concentration than the p-type substrate 1.

Subsequently, the ion-implantation system is adjusted in such a manner that the predetermined angle A1 is zero, and arsenic As is ion-implanted into the major surface of the p-type semiconductor substrate 1 at dose of $7 \times 10^{14}$ cm$^{-2}$ under the acceleration energy of 30 KeV, and a shallow n-type drain region 1c is formed in a self-aligned manner to the gate structure 2 as shown in FIG. 1C.

The mask 3 is stripped off, and a photoresist film covers over the entire surface. The photoresist film is patterned into a mask 5 for an ion-implantation through the lithographic process, and the mask 5 covers the remaining part of the gate structure 2 and a part of the shallow n-type drain region 1c. The part of the gate structure 2, the predetermined area assigned to the source region and the remaining part of the shallow n-type drain region 1c are ready for ion-implantation. Using the mask 5, arsenic As is ion-implanted at dose of $5 \times 10^{15}$ cm$^{-2}$ under acceleration energy of 70 KeV, and a heavily doped n-type source region 1d and a heavily doped deep n-type drain region 1e are formed as shown in FIG. 1D. The heavily doped n-type source region 1d is self-aligned to the gate structure 2, and the heavily doped deep n-type drain region is offset from the gate structure 2. The shallow n-type drain region 1c and the heavily doped deep drain region 1e form in combination an n-type drain region 1f.

The p-type impurity region 1b enhances the injection efficiency of hot electrons, because the p-n junction between the p-type impurity region 1b and the n-type drain region 1f is liable to be broken down and produces a large amount of hot electrons.

The shallow n-type drain region 1c prevents the floating gate electrode 2b from the drain disturb. In detail, a plurality of floating gate type memory cells are arranged in rows and columns in the non-volatile semiconductor memory device, and word lines interconnect the control gate electrodes 2d in the associated rows, respectively. On the other hand, the n-type drain regions 1f of the columns are respectively connected with bit lines. When accessing a data bit stored in one of the floating gate type memory cells, one of the word lines is driven to an active level regulated between a high threshold level and a low threshold level to see whether or not conductive channels take place in the channel, regions 1a of the floating gate type memory cells in the selected row. Current is supplied to one of the bit lines, and the selected bit line is monitored to see whether the read-out voltage level on the selected bit line is decayed or maintained. Therefore, the read-out voltage level is applied to not only the n-type drain region 1f of the selected floating gate type memory cell but also the n-type drain regions 1f of the non-selected floating gate type memory cells in the same column.

In this situation, if the heavily doped deep drain region 1e is aligned to the gate structure 2, hot holes produced at the p-n junction are liable to be injected into the floating gate electrode of the non-selected floating gate type memory cell through a tunneling across the first gate oxide film, and cancel the accumulated electrons. This undesirable phenomenon is called as the drain disturb. The heavily-doped deep n-type drain region 1e is desirable for accelerating the propagation of the read-out voltage. However, the heavily-doped deep n-type drain region 1e is undesirable for stability of the data bit stored in the floating gate electrode. The prior art non-volatile semiconductor memory device compromises these problems, and the heavily-doped deep n-type drain region 1e is spaced from the gate structure 2.

Thus, the offset heavily doped deep drain region 1e is desirable for the floating gate type memory cell. However, a problem is encountered in the prior art process sequence in that the impurity profile of the n-type drain region 1f is abruptly changed, and the drain disturb can not be suppressed in the presence of a strong electric field due to the abrupt change of the impurity profile.

SUMMARY OF THE INVENTION

It is therefore an important object of the present invention to provide a process of fabricating a floating gate type field effect transistor which can effectively suppress the drain disturb.

To accomplish the object, the present invention proposes to repeat an ion implantation for gently changing the impurity profile of a drain region.

In accordance with the present invention, there is provided a process of fabricating a floating gate type field effect transistor, comprising the steps of: a) preparing a semiconductor substrate of one conductivity type; b) forming a gate structure on a channel region in a major surface of the semiconductor substrate, the gate structure having a first gate insulating layer on the channel region, a floating gate electrode on the first gate insulating layer, a second gate insulating layer on the floating gate electrode and a control gate electrode on the second gate insulating layer; c) repeating an oblique ion-implantation with impurity atoms of the opposite conductivity type to the one conductivity type into a first area of the major surface on one side of the gate structure at different angles for forming a first drain sub-region varied in impurity concentration; d) ion-implanting with impurity atoms of the opposite conductivity type into a part of the first area spaced from the gate structure for forming a second drain sub-region larger in impurity concentration than the first drain sub-region, the first drain sub-region and the second drain sub-region being partially overlapped for forming a drain region; and e) completing the floating gate type field effect transistor.

BRIEF DESCRIPTION OF THE DRAWINGS

The feature and advantages of the process of fabricating a floating gate type field effect transistor according to the present invention will be more clearly understood from the following description taken in conjunction with the accompanying drawings in which.

DESCRIPTION OF THE PREFERRED EMBODIMENTS

First Embodiment

Figure 1A:
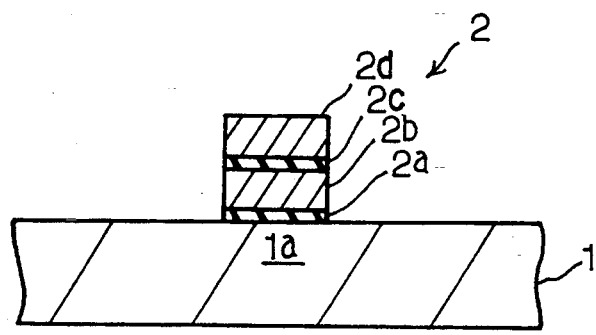
FIGS. 1A to 1D is cross sectional views showing the prior art process sequence for fabricating the floating gate type field effect transistor.
Figure 1B:
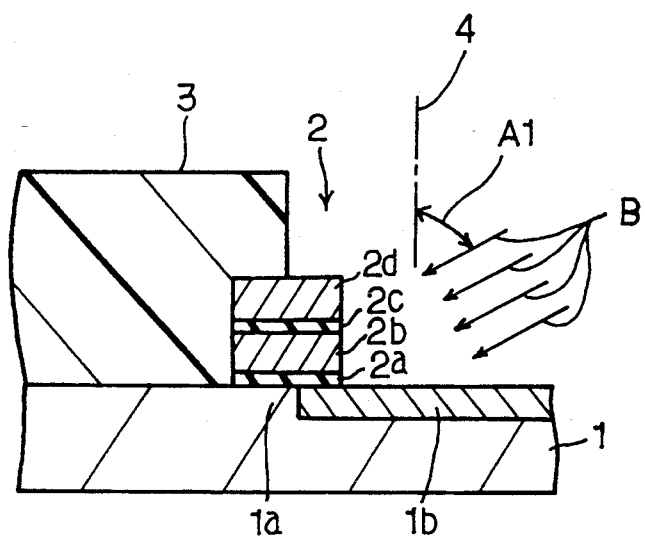
Figure 1C:
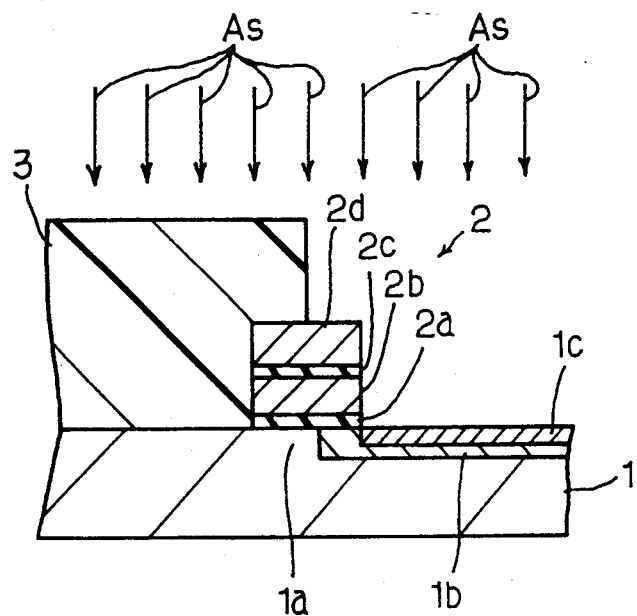
Figure 1D:
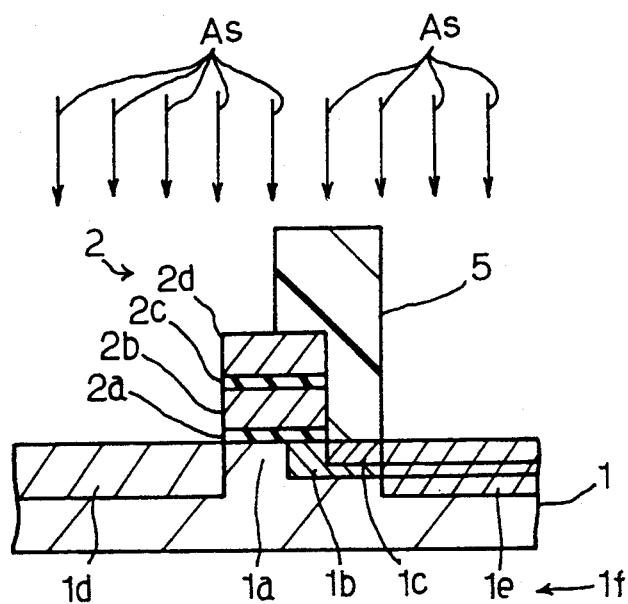
Figure 2A:
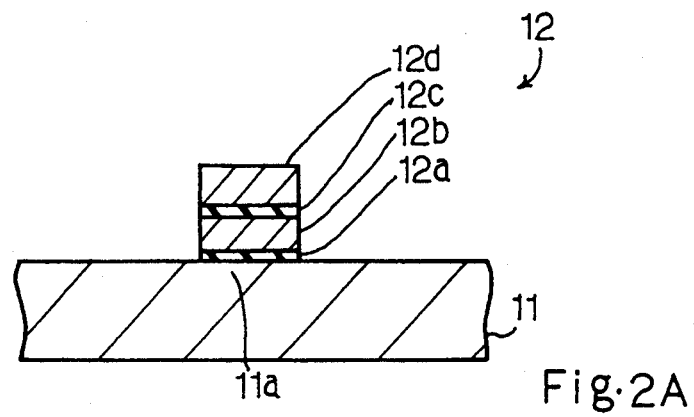
FIGS. 2A to 2F are cross sectional views showing a process sequence for fabricating a floating gate type field effect transistor according to the present invention.

Referring to FIG. 2A of the drawings, a process sequence for fabricating a floating gate type field effect transistor starts with preparation of a lightly doped p-type silicon substrate 11, and an active area is defined by, for example, a thick field oxide film (not shown) grown on the major surface of the p-type silicon substrate. The active area is thermally oxidized so that a thin silicon oxide film is grown. Polysilicon is deposited over the entire surface, and the polysilicon film is doped with p-type impurity. An appropriate mask is patterned on the polysilicon film through a lithographic process, and the polysilicon film and the thin silicon oxide film are partially etched away. A part of the thin silicon oxide film and a part of the polysilicon film covered with the mask are left on the active area, and are shaped into respective configurations similar to a first gate oxide film and a floating gate electrode.

The part of the polysilicon film left over the active area is thermally oxidized so that a thin silicon oxide film wraps the part of the polysilicon film. Polysilicon is deposited over the entire surface again, and the polysilicon film is doped with p-type impurity. An appropriate mask is patterned on the polysilicon film through the lithographic process, and the polysilicon film, the thin silicon oxide films are sequentially etched away so that a first gate insulating film 12a, a floating gate electrode 12b, a second gate insulating film 12c and a control gate electrode 12d are stacked over a channel region 11a defined in the active area. The first gate insulating film 12a, the floating gate electrode 12b, the second gate insulating film 12c and the control gate electrode 12d as a while constitute a gate structure 12.

A photoresist film is spun onto the entire surface of the structure shown in FIG. 2A, and the photoresist film is patterned into a mask 13 through the lithographic process. The mask 13 covers a part of the active area assigned to a source region and a part of the top surface of the gate structure 12. However, the mask 13 uncovers another part of the active area assigned to a drain region and the remaining part of the gate structure 12.

Figure 2B:
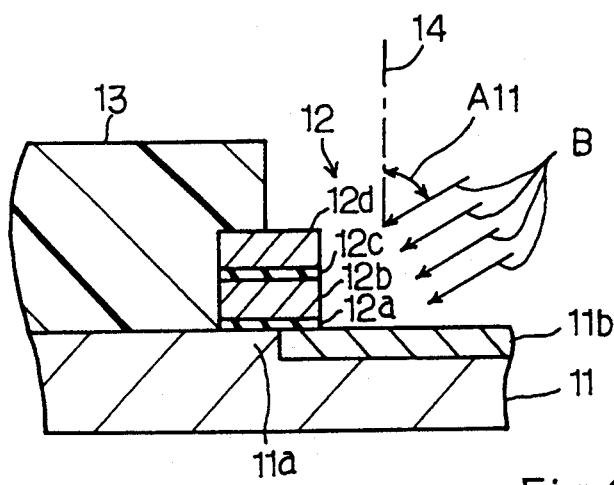

The p-type silicon substrate 11 is placed in an ion-implantation system (now shown), and the ion-implantation system is adjusted in such a manner as to radiate boron B at a first predetermined angle A11. In this instance, the radiation of boron B declines from a normal line 14 with respect to the major surface at 60 degrees, and is implanted at dose of $3 \times 10^{13}$ cm$^{-2}$ under acceleration energy of 70 KeV. Then, a p-type impurity region 11b is formed in the active area, and extends from the area assigned to the drain region to a part of the channel region 11a beneath the first gate insulating film 12a. The resultant structure is illustrated in FIG. 2B. The p-type impurity region 11b is conducive to enhancement of an injection efficiency of hot electrons.

Figure 2C:
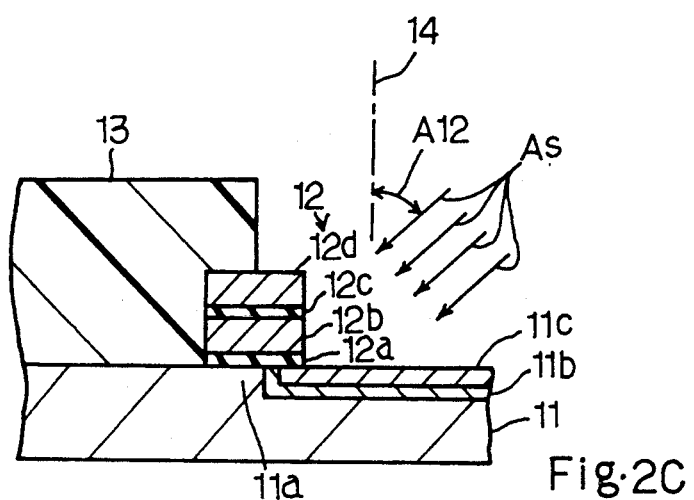

The ion-implantation system is regulated in such a manner as to radiate an impurity at a second predetermined angle A12 with respect to the normal line 14. In this instance, the second predetermined angle A12 is adjusted to 45 degrees. Using the mask 13, arsenic As is ion-implanted into the uncovered p-type silicon substrate 11 at dose of $1 \times 10^{14}$ cm$^{-2}$ under acceleration energy of 70 KeV, and a first drain sub-region 11c is formed in the p-type impurity region 11b. Since the arsenic is obliquely implanted, the periphery of the first drain sub-region 11c is beneath the first gate insulating film 12a as shown in FIG. 2C.

Figure 2D:
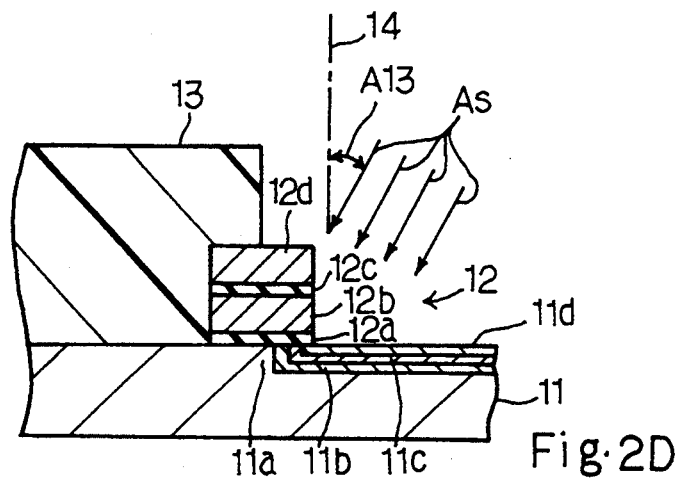
Figure 2E:
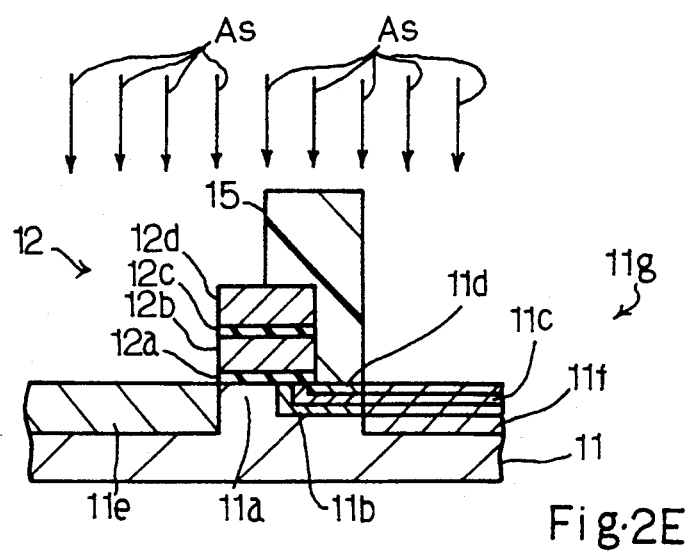
Figure 2F:
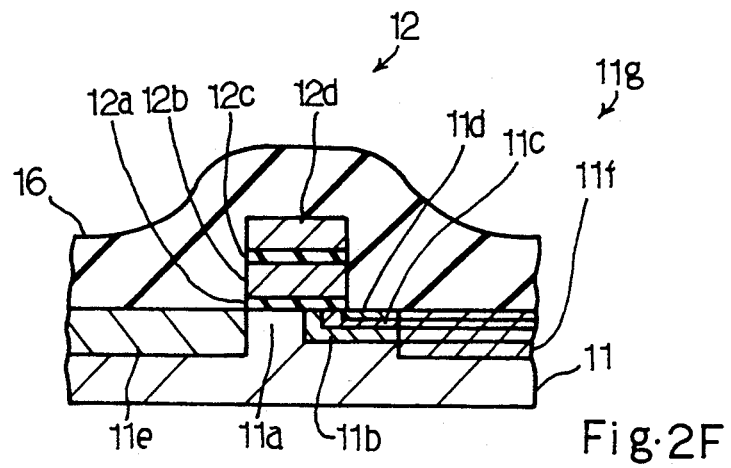

The ion-implantation system is regulated to a third predetermined angle A13, and arsenic As is ion-implanted into the uncovered p-type silicon substrate 11 at dose of $7 \times 10^{14}$ cm$^{-2}$ under acceleration energy of 30 KeV. In this instance, the third predetermined angle A13 is 30 degrees. Then, a surface portion 11d of the first drain sub-region 11c is increased in impurity concentration. The resultant structure is illustrated in FIG. 2D.

Thus, the oblique ion-implantation is repeated twice, and the impurity profiles achieved by the respective ion-implantations are merged so as to gently vary in the first drain sub-region 11c. The mask 13 is stripped off, and a photoresist film is spun onto the entire surface again. The photoresist film is patterned into a mask 15 through the lithographic process. The mask 15 covers a part of the top surface of the gate structure 12 and a part of the first drain sub-region 11c closer to the gate structure 12, and uncovers the area assigned to the source region and the remaining part of the first drain sub-region 11c. The ion-implantation system is regulated to vertically radiate arsenic As, and the arsenic is implanted into the uncovered p-type substrate 11 at dose of $5 \times 10^{15}$ cm$^{-2}$ under acceleration energy of 70 KeV. The projected range of the last ion-implantation is larger than those of the previous ion-implantations, and a deep source region 11e and a deep second drain sub-region 11f are formed in the active area. The second drain sub-region 11f is partially overlapped with the first drain sub-region 11c, and form in combination a drain region 11g.

The impurity profiles of arsenic achieved by the three ion-implantations are different from one another, and are merged into a composite impurity profile gently varying over the drain region 11g. As a result, when a positive read-out voltage is applied to the drain region 11g, the electric field laterally extending toward the periphery of the drain region 11g is weaker than that of the prior art drain region 1f, and hot holes are not strongly accelerated. For this reason, only a negligible amount of hot holes are injected into the floating gate electrode 2b, and accumulated electrons are maintained for a prolonged time period.

The mask 15 is stripped off, and an insulating substance such as silicon oxide is deposited over the entire surface of the structure. The insulating substance forms an inter-level insulating film 16, and conductive wirings (not shown) extends over the inter-level insulating film 16. One of the conductive wirings passes through a contact hole formed in the inter-level insulating film 16, and is held in contact with the drain region 11g.

Figure 3A:
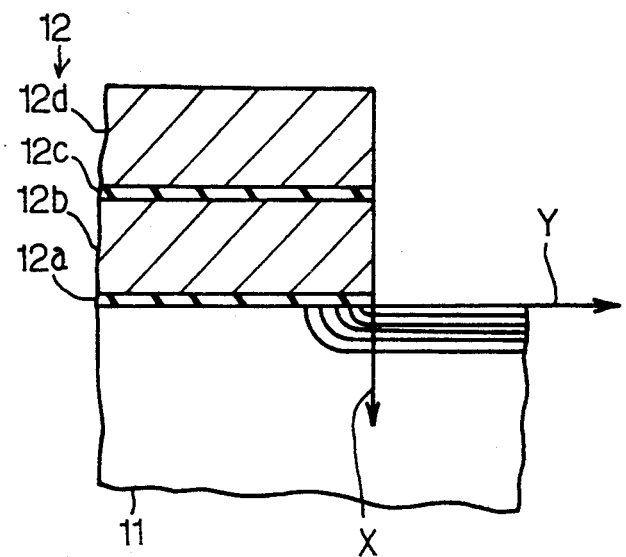
FIG. 3A is a view showing a composite impurity profile of a drain region of the floating gate type field effect transistor shown in FIG. 2F.
Figure 3B:
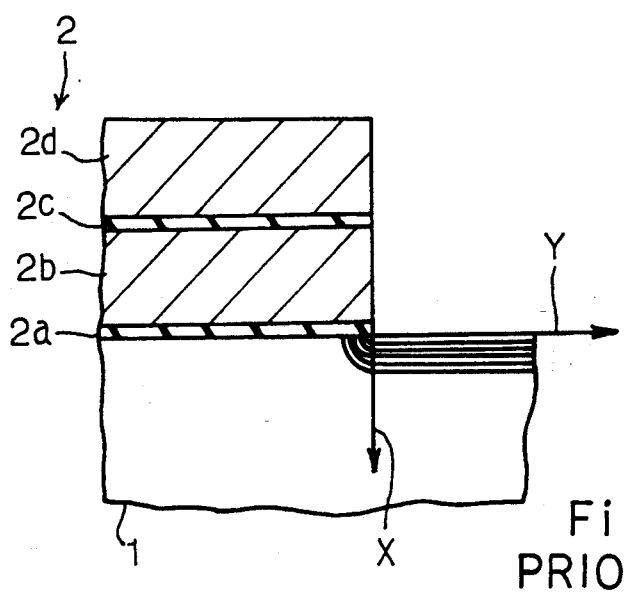
FIG. 3B is a view showing the composite impurity profile of the drain region of the prior art floating gate type field effect transistor.
Figure 4:
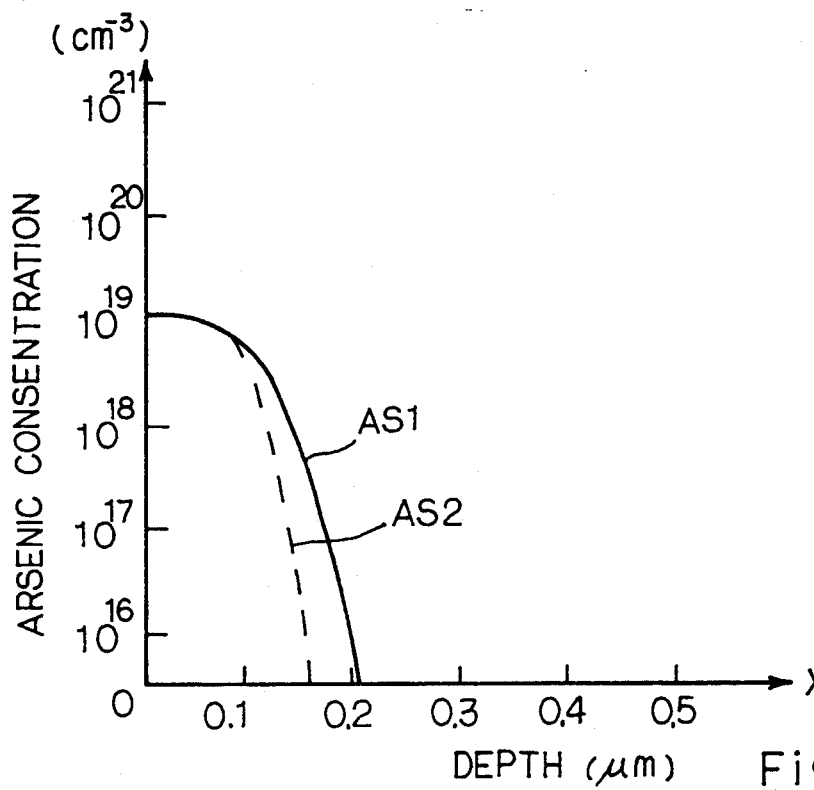
FIG. 4 is a graph showing arsenic concentration in terms of depth.
Figure 5:
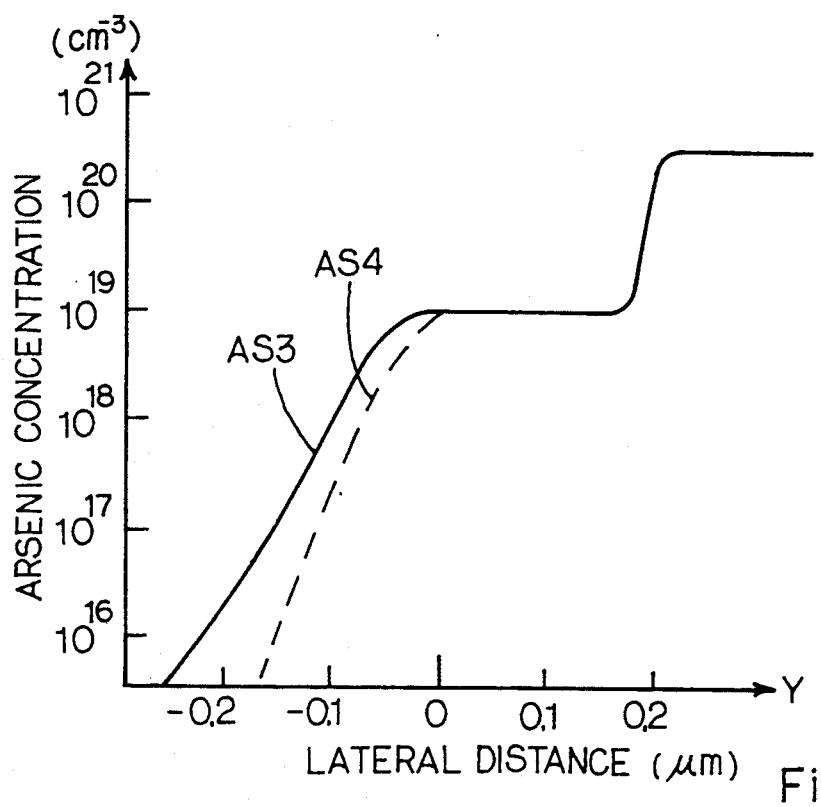
FIG. 5 is a graph showing arsenic concentration in terms of lateral distance.

The composite impurity profile in the first drain sub-region 11c and the impurity profile of the prior art shallow n-type impurity region 1c were measured. FIG. 3A shows the contours of equal-ion concentrations measured in the first drain sub-region 11c, and FIG. 3B shows the counters measured in the shallow n-type impurity region 1c. In FIGS. 3A and 3B, X indicates lateral distances from the right edge of the first gate insulating films, and Y indicates depths from the right edges of the bottom surfaces of the first gate insulating films. The arsenic concentration in terms of the depth Y was plotted in FIG. 4, and the arsenic concentration in terms of the lateral distance X was plotted in FIG. 5. Plots AS1 and AS3 are indicative of the arsenic concentrations in the first drain sub-region 11c, and Plots AS2 and AS4 indicate the arsenic concentrations in the shallow n-type impurity region 1c.

Comparing FIG. 3A with FIG. 3B, it was understood that the composite impurity profile of the first drain sub-region 11c gently varied rather than the impurity profile of the shallow n-type impurity region 1c. The gentle impurity profile results in a weak electric field.

Therefore, it was confirmed that the oblique ion implantations at different angles were advantageous over the single oblique ion-implantation in the prior art process sequence in improvement of durability of the accumulated electrons.

Second Embodiment

Figure 6A:
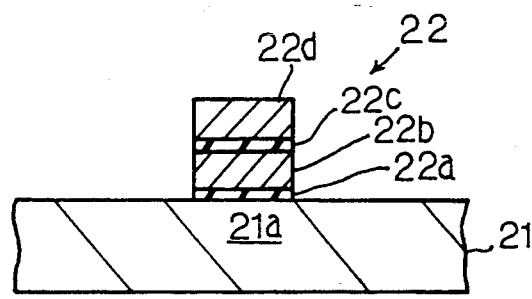
FIGS. 6A to 6H are cross sectional views showing another process sequence for fabricating a floating gate type field effect transistor according to the present invention.

Turning to FIGS. 6A to 6G of the drawings, another process sequence embodying the present invention is illustrated. The process sequence starts with preparation of a p-type semiconductor substrate 21. A gate structure 22 is formed on a channel region 21a in a major surface of the p-type semiconductor substrate 21 as similar to the first embodiment, and has a first gate insulating layer 22a, a floating gate electrode 22b, a second gate insulating layer 22c and a control gate electrode 22d as shown in FIG. 6A.

Figure 6B:
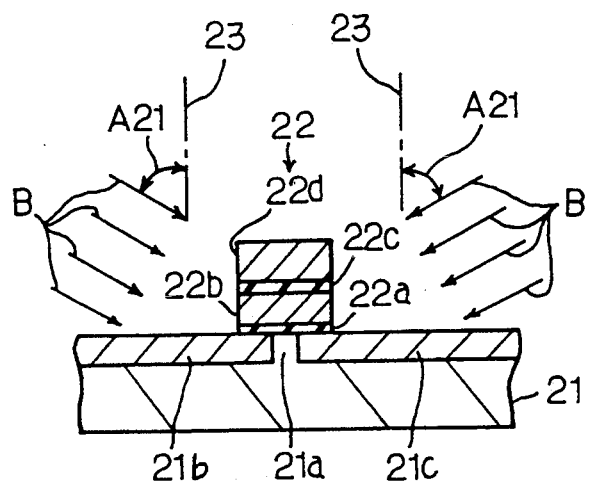
Figure 6C:
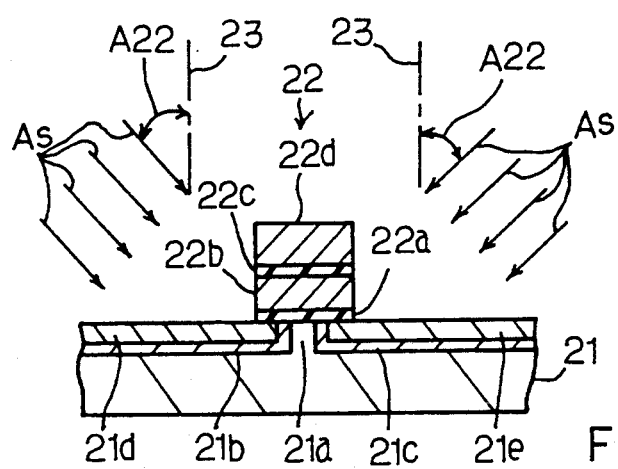

Subsequently, the p-type semiconductor substrate 21 is placed in an ion-implantation system (not shown). Using the gate structure 22 as a mask, boron B is obliquely ion-implanted into the p-type silicon substrate 21 at dose of $3 \times 10^{13}$ cm$^{-2}$ under acceleration energy of 70 KeV. While the boron is radiated, the p-type semiconductor substrate 21 is driven for rotation, and p-type impurity regions 21b and 21c are formed in the active area as shown in FIG. 6B. The peripheries of the p-type impurity regions 21b and 21c reach the channel region 21a beneath the first gate insulating film 22a. The ion-implantation with the boron is carried out at a first predetermined angle A21 from normal lines 23 with respect to the major surface of the p-type semiconductor substrate 21, and the first predetermined angle A21 is 60 degrees in this instance.

Using the gate structure 22 as a mask again, arsenic atoms As are obliquely ion-implanted at a second predetermined angle A22 at dose of $1 \times 10^{14}$ cm$^{-2}$ under acceleration energy of 70 KeV. In this instance, the second predetermined angle A22 is 45 degrees with respect to the normal lines 23. While the arsenic atoms As are obliquely ion-implanted, the p-type semiconductor substrate 21 is driven for rotation, and first source/drain regions 21d and 21e are formed in the p-type impurity regions 21b and 21c, respectively, as will be seen from FIG. 6C.

Figure 6D:
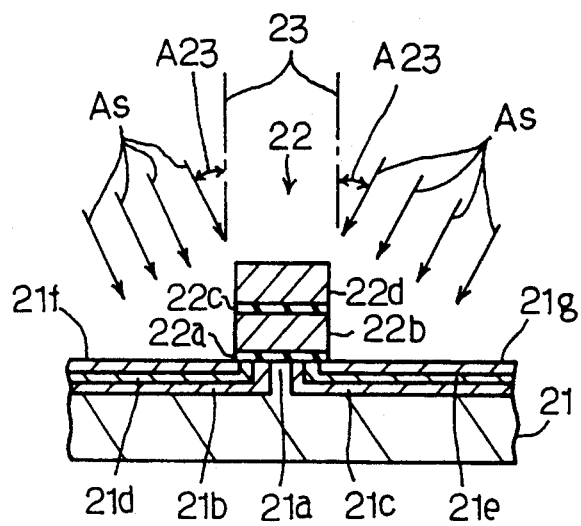

The ion-implantation system is regulated in such a manner that the arsenic atoms are radiated at a third predetermined angle A23 with respect to the normal lines 23, and the third predetermined angle A23 is 30 degrees in this instance. Arsenic atoms As are obliquely ion-implanted into the p-type semiconductor substrate 21 at dose of $7 \times 10^{14}$ cm$^{-2}$ under acceleration energy of 30 KeV. While carrying out the oblique ion-implantation, the p-type semiconductor substrate 21 is driven for rotation, and the arsenic atoms are implanted into surface portions 21f and 21g of the first source/drain sub-regions 21d and 21e, respectively, as shown in FIG. 6D.

Figure 6E:
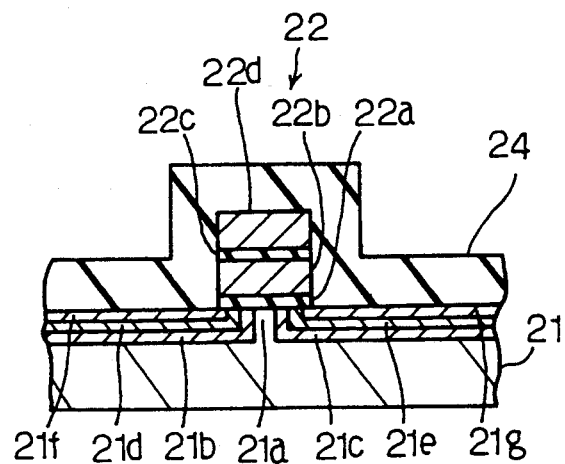

The p-type semiconductor substrate 21 is taken out from the ion-implantation system, and is placed in a reactor (not shown) for a chemical vapor deposition. Silicon oxide is deposited over the entire surface, and a silicon oxide film 24 covers the exposed major surface and the gate structure 22 as shown in FIG. 6E.

Figure 6F:
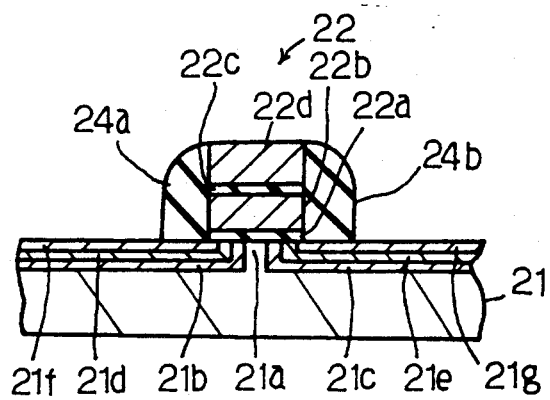

The silicon oxide film 24 is anisotropically etched away through, for example, a reactive ion etching, and side walls 24a and 24b are left on both sides of the gate structure 22 as shown in FIG. 6F.

Figure 6G:
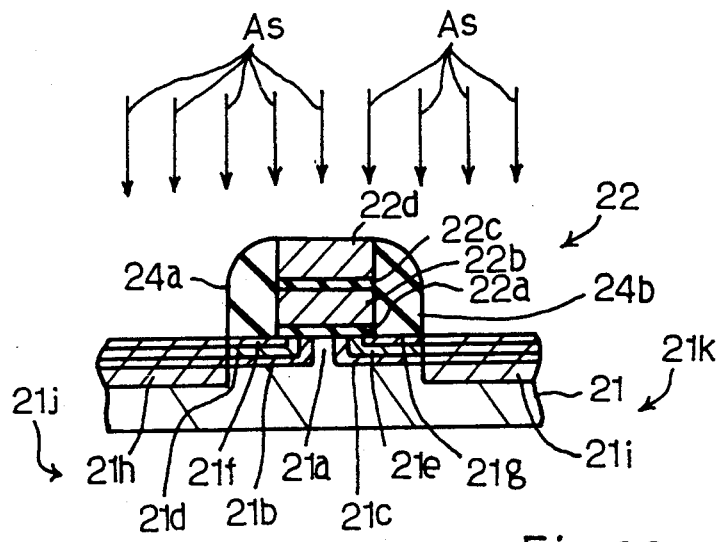

The p-type semiconductor substrate 21 is placed in the ion-implantation system (not shown) again. Arsenic atoms As are vertically ion-implanted into the uncovered semiconductor substrate 21 at dose of $5\times10^{15}$ cm$^{-2}$ under acceleration energy of 70 KeV. Then, deep second source/ drain sub-regions 21h and 21i are formed in the p-type semiconductor substrate 21 on both sides of the side walls 24a and 24b as shown in FIG. 6G, and the first source/ drain sub-regions 21d and 21e and the second source/drain sub-regions 21h and 21i are partially overlapped with one another, and form source/drain regions 21j and 21k.

Figure 6H:
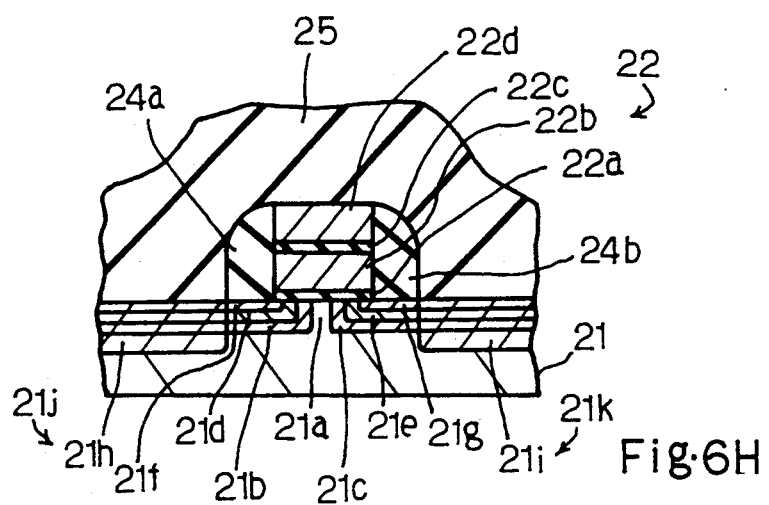

Finally, an inter-level insulating film 25 is deposited over the entire surface as shown in FIG. 6H, and wirings are patterned on the inter-level insulating film 25 as similar to the first embodiment.

The composite impurity profiles in the source and drain regions 21j and 21k gently vary by virtue of the repetition of the oblique ion-implantation, and achieve the advantages of the first embodiment. Moreover, the process sequence shown in FIGS. 6A to 6H produces the source and drain regions 21j and 21k in symmetry with each other.

As will be appreciated from the foregoing description, the repetition of the oblique ion-implantation according to the present invention gently varies an impurity profile of the drain region, and the gentle impurity profile decreases an electric field created in the periphery of the drain region. This means that holes are not strongly accelerated, and are hardly injected into the floating gate electrode. For this reason, the accumulated electrons are not attacked by the holes, and are maintained in the floating gate electrode for a prolonged time period.

Although particular embodiments of the present invention have been shown and described, it will be obvious to those skilled in the art that various changes and modifications may be made without departing from the spirit and scope of the present invention. For example, the process sequence described hereinbefore may form a part of a process sequence for forming a non-volatile semiconductor memory device such as an electrically programmable read only memory device, an electrically erasable and programmable read only memory device and a flash-type electrically erasable and programmable read only memory device, and a composite gate insulating film structure such as a silicon nitride film sandwiched between silicon oxide films may be inserted between a floating gate electrode and a control gate electrode. Moreover, the oblique ion-implantation may be repeated more than twice, and implanted impurity may be phosphorus or another donor impurity. Finally, the p-type impurity regions 11b and 21b/21c may be deleted from the floating gate type field effect transistors according to the present invention.

What is claimed is:

1. A process of fabricating a floating gate type field effect transistor, comprising the steps of:
    a) preparing a semiconductor substrate of one conductivity type;
    b) forming a gate structure on a channel region in a major surface of said semiconductor substrate, said gate structure having a first gate insulating layer on said channel region, a floating gate electrode on said first gate insulating layer, a second gate insulating layer on said floating gate electrode and a control gate electrode on said second gate insulating layer;
    c) repeating an oblique ion-implantation with impurity atoms of the opposite conductivity type to said one conductivity type into a first area of said major surface on one side of said gate structure at different angles for forming a first drain sub-region varied in impurity concentration, a dose of said oblique ion-implantation being regulated to a middle value less than $1\times10^{15}$ cm$^{-2}$ so as to hardly convert said first drain sub-region into an amorphous state and to produce hot carriers injected into said floating gate electrode;
    d) ion-implanting with impurity atoms of said opposite conductivity type into a part of said first area spaced from said gate structure for forming a second drain sub-region having an impurity concentration which is larger than the impurity concentration of said first drain sub-region, said first drain sub-region and said second drain sub-region being partially overlapped for forming a drain region; and
    e) completing said floating gate type field effect transistor.

2. A process of fabricating a floating gate type field effect transistor as set forth in claim 1, in which a source region is simultaneously formed through the ion-implantation at said step e).

3. A process of fabricating a floating gate type field effect transistor as set forth in claim 1, in which said different angles in said step c) is measured from a normal line with respect to said major surface, and are decreased with repetition of the oblique ion-implantation.

4. A process of fabricating a floating gate type field effect transistor as set forth in claim 3, in which a dose in said oblique ion-implantation is increased with the repetition, and an acceleration energy applied to said impurity atoms in said oblique ion-implantation is decreased with the repetition.

5. A process of fabricating a floating gate type field effect transistor as set forth in claim 4, in which said impurity atoms in said step c) are arsenic, said dose being increased from $1\times10^{14}$ cm$^{-2}$ at an implanting angle of 45 degrees to $7\times10^{14}$ cm$^{-2}$ at an implanting angle 30 degrees, said acceleration energy being decreased from 70 KeV to 30 KeV, said implanting angles being measured from said normal line.

6. A process of fabricating a floating gate type field effect transistor as set forth in claim 4, a dose in said step d) is greater than said dose in said oblique ion-implantation, and an acceleration energy in said step d) is not less than said acceleration energy in said oblique ion-implantation.

7. A process of fabricating a floating gate type field effect transistor as set forth in claim 6, in which said impurity atoms in said step d) are arsenic, said dose in said step d) at an implanting angle of zero being $5\times10^{15}$ cm$^{-2}$, said acceleration energy in said step d) being 70 KeV.

8. A process of fabricating a floating gate type field effect transistor as set forth in claim 1, in which said process further comprises the step of forming a first impurity region of said one conductivity type extending from said first drain sub-region into a part of said channel region between said step b) and said step c), said first drain sub-region being formed in said first impurity region for forming a p-n junction.

9. A process of fabricating a floating gate type field effect transistor as set forth in claim 1, in which said semiconductor substrate is driven for rotation in said step c) so that a first source sub-region is simultanously formed on the other side of said gate structure.

10. A process of fabricating a floating gate type field effect transistor as set forth in claim 9, in which said process further comprises the step of forming side walls on both side surfaces of said gate structure between said step c) and said step d), said side walls covering a part of said first drain sub-region and a part of said first source sub-region.

11. A process of fabricating a floating gate type field effect transistor as set forth in claim 10, in which a second source sub-region is simultaneously formed in said step e), said second source sub-region being partially overlapped with said first source sub-region.

12. A process of fabricating a floating gate type field effect transistor as set forth in claim 12, in which said process further comprises the step of forming first impurity regions of said one conductivity type extending into parts of said channel region between said step b) and said step c), said first drain sub-region and said first source sub-region being formed in said first impurity regions for forming p-n junctions, respectively.

13. A process of fabricating a floating gate type field effect transistor as set forth in claim 12, in which said semiconductor substrate is driven for rotation during the step of forming said first impurity regions so that said first drain sub-region and said first source sub-region are simultaneously formed in symmetry with each other.

* * * * *